United States Patent
Yang et al.

(10) Patent No.: US 9,012,775 B2
(45) Date of Patent: Apr. 21, 2015

(54) WIRE FIXING STRUCTURE AND LIQUID CRYSTAL DISPLAY DEVICE USING THE SAME

(75) Inventors: Rui-Lian Yang, Guangdong (CN); Chong Huang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 21 days.

(21) Appl. No.: 13/496,819

(22) PCT Filed: Dec. 31, 2011

(86) PCT No.: PCT/CN2011/085109
§ 371 (c)(1),
(2), (4) Date: Mar. 16, 2012

(87) PCT Pub. No.: WO2013/082843
PCT Pub. Date: Jun. 13, 2013

(65) Prior Publication Data
US 2013/0140077 A1   Jun. 6, 2013

(30) Foreign Application Priority Data
Dec. 5, 2011   (CN) .......................... 2011 1 0399211

(51) Int. Cl.
*H02G 3/04*   (2006.01)
*H02G 3/32*   (2006.01)
*H05K 7/14*   (2006.01)

(52) U.S. Cl.
CPC .................................. *H05K 7/1447* (2013.01)

(58) Field of Classification Search
USPC .... 174/72 A, 68.1, 40 CC, 72 TR, 74 R, 481, 174/135; 248/73, 68.1, 71, 74.2, 74.4, 74.1, 248/49, 62
See application file for complete search history.

(56) References Cited

U.S. PATENT DOCUMENTS

| | | | | |
|---|---|---|---|---|
| 3,157,377 A | * | 11/1964 | Orenick ....................... | 248/74.3 |
| 3,659,319 A | * | 5/1972 | Erickson ....................... | 248/74.1 |
| 4,023,758 A | * | 5/1977 | Yuda ............................. | 248/74.3 |
| 4,805,479 A | * | 2/1989 | Brightwell ................... | 248/74.2 |
| D329,588 S | * | 9/1992 | Michel, Jr. .................... | D8/395 |
| 5,209,441 A | * | 5/1993 | Satoh ............................ | 248/74.2 |
| 6,220,554 B1 | * | 4/2001 | Daoud ......................... | 248/74.1 |
| 6,371,419 B1 | * | 4/2002 | Ohnuki ....................... | 248/74.2 |
| D473,449 S | * | 4/2003 | Wu et al. ....................... | D8/356 |
| 6,641,093 B2 | * | 11/2003 | Coudrais ...................... | 248/68.1 |
| 6,809,257 B2 | * | 10/2004 | Shibuya ....................... | 174/72 A |
| 7,523,898 B1 | * | 4/2009 | Barry et al. .................. | 248/74.1 |
| 7,527,226 B2 | * | 5/2009 | Kusuda et al. .............. | 248/68.1 |

(Continued)

FOREIGN PATENT DOCUMENTS

| CN | 201170525 Y | 12/2008 |
|---|---|---|
| CN | 101608651 A | 12/2009 |
| CN | 102032501 A | 4/2011 |

(Continued)

*Primary Examiner* — Angel R Estrada
(74) *Attorney, Agent, or Firm* — Muncy, Geissler, Olds & Lowe, P.C.

(57) ABSTRACT

A wire fixing structure and a liquid crystal display device using the same, wherein the wire fixing structure comprises a base and a clamping portion extended from the base, a wire fixing ring is formed by an enclosure of the clamping portion and the base for a wire to be inserted into. Thereby, the wire can be fixed in the liquid crystal display device conveniently and securely by the present technology.

1 Claim, 2 Drawing Sheets

(56) References Cited

U.S. PATENT DOCUMENTS 8,215,819 B2 7/2012 Moro et al.
8,262,035 B2 * 9/2012 Bleus et al. .................. 248/68.1
8,286,923 B2 * 10/2012 Kobayashi et al. .......... 248/74.2

2012/0063119 A1 3/2012 Lei et al.

FOREIGN PATENT DOCUMENTS

CN 201836832 U 5/2011

* cited by examiner

WIRE FIXING STRUCTURE AND LIQUID CRYSTAL DISPLAY DEVICE USING THE SAME

FIELD OF THE INVENTION

The present invention relates to a liquid crystal display device and more particularly to a structure of a wire fixing structure in the liquid crystal display device.

BACKGROUND OF THE INVENTION

A liquid crystal display device typically comprises a case as well as a panel, a back light module and related electronic circuits installed inside the case, and wires are used for electrical connection between the functional modules. In conventional fixing methods, the wires are usually fixed by winding with a plurality of rivets and strings first, and then adhered by double tapes, some use polyester films to adhere and fix the wires. These conventional existing methods are not secured and it is not easy to be re-worked if adhering by tapes. Therefore, the conventional structures of the wire fixing structures for the liquid crystal display device need to be improved.

SUMMARY

In order to solve the abovementioned technical problem, the present invention provides a structure of a wire fixing structure of a liquid crystal display device by which wires can be fixed securely and maintained conveniently.

Technical solutions employed by the present invention to solve the abovementioned technical problem include providing a wire fixing structure of a liquid crystal display device which comprises a base and a clamping portion extended from the base, a wire fixing ring is formed by an enclosure of the clamping portion and the base for a wire to be inserted into.

The clamping portion includes two elastic clamping arms extended upward from the base, a span between free ends of the two elastic clamping arms is slightly smaller than a radial dimension of the wire.

The clamping portion includes a curved arm; two ends of the curved arm are fixed on the base.

A radial dimension of the wire fixing ring is slightly larger than the radial dimension of the wire.

The base is a flat plate structure and is in a circular or rectangular shape.

The wire fixing structure is made of polymer material and formed integrally by injection molding.

The wire fixing structure further comprises a fixing portion disposed on a side of the base opposite to the clamping portion.

The fixing portion includes a main body extended downward from the base and at least one elastic snap aim extended from the main body.

The elastic snap arm includes two elastic snap arms extended from two sides of the main body symmetrically and oppositely to the extending direction of the main body.

Technical solutions employed by the present invention to solve the abovementioned technical problem further include providing a liquid crystal display device which comprises the wire fixing structure.

Compared with conventional techniques, according to the wire fixing structure and liquid crystal display device using the same of the present invention, which provide the wire fixing ring for a wire to be inserted into, thereby the wire can be fixed securely and conveniently in the liquid crystal display device.

DETAILED DESCRIPTION OF THE INVENTION

The present invention will become more fully understood by reference to the following detailed description thereof when read in conjunction with the attached drawings.

Figure 1:
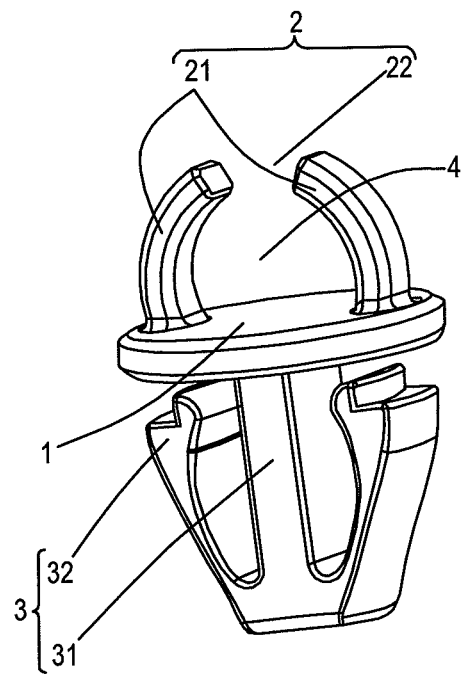
FIG. 1 is a structural illustration of a wire fixing structure of a liquid crystal display device according to a first embodiment of the present invention.
Figure 2:
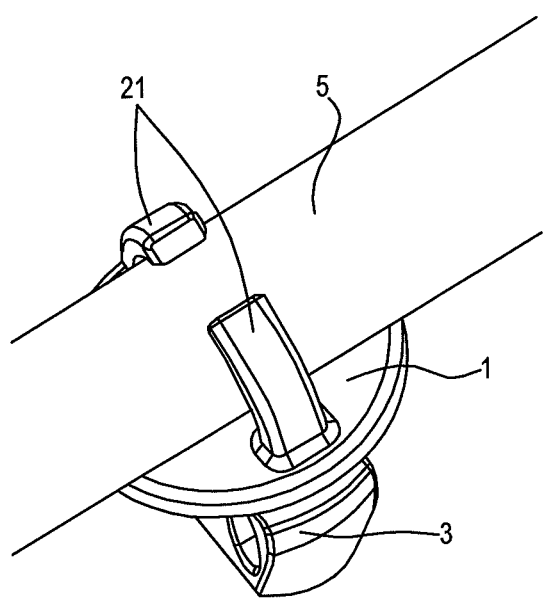
FIG. 2 is an illustration of a wire being fixed by the wire fixing structure of the liquid crystal display device according to the first embodiment of the present invention.

Referring to FIGS. 1 and 2, a first embodiment of a structure of a wire fixing structure of a liquid crystal display device of the present invention mainly comprises: a base 1 and a clamping portion 2 extended from the base 1, a wire fixing ring 4 is formed by an enclosure of the clamping portion 2 and the base 1 for a wire 5 to be inserted into. Preferably, a radial dimension of the wire fixing ring 4 is slightly larger than a radial dimension of the wire 5, so that the wire 5 can be fixed securely in the wire fixing ring 4.

The wire fixing structure is made of polymer material and formed integrally by injection molding. The base 1 is a flat plate structure and is in a circular shape. The clamping portion 2 includes two elastic clamping arms 21 extended upward from an upper surface of the base 1, a gap 22 is formed between free ends of the two elastic clamping arms 21, a span of the gap 22 is slightly smaller than the radial dimension of the wire 5.

Referring to FIG. 2, when the wire 5 is being securely fixed in the wire fixing ring 4, the gap 22 is forced to be opened so that the wire 5 can be snapped into the wire fixing ring 4 through the gap 22, then the span of the gap 22 will be restored automatically, so the wire 5 can be fixed securely in the wire fixing ring 4.

The wire fixing structure can further comprises a fixing portion 3 disposed on the base 1 at an opposite side of the clamping portion 2. The fixing portion 3 includes a main body 31 extended downward from the base 1 and two elastic snap arms 32 extended from two sides of the main body 31 symmetrically and oppositely to the extending direction of the main body 31.

When the wire fixing structure is required to be detachably installed on components, such as a back case (not illustrated in the drawings) of the liquid crystal display device, a snap socket can be disposed at an appropriate location on the components, thereby, simply have the fixing portion 3 snapped into the snap socket for the wire 5 to be fixed securely and conveniently with a high flexibility.

Accordingly, when re-work or maintenance is required, the wire fixing structure can be detached from the components by using the fixing portion 3, and/or the wire 5 can be removed from the wire fixing structure by using the two elastic clamping arms 21. Therefore, the wire fixing structure can be used conveniently and with a high flexibility.

It should be noted that, the fixing portion 3 can be embodied in many different ways, for examples, the snap structure can be replaced by a gripper structure, or a structure with an installing hole to cooperate with a fixing element for installation. The wire fixing structure can also be formed directly on the components such as a back case so that it is formed as a part of the component, thereby the fixing portion 3 does not have to be formed, or the fixing portion 3 can be regarded as being formed integrally with the base 1.

Figure 3:
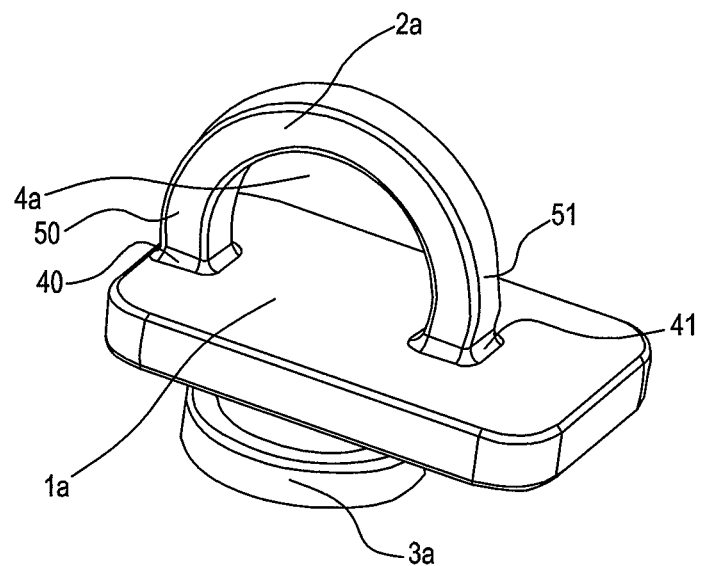
FIG. 3 is a structural illustration of the wire fixing structure of the liquid crystal display device according to a second embodiment of the present invention.
Figure 4:
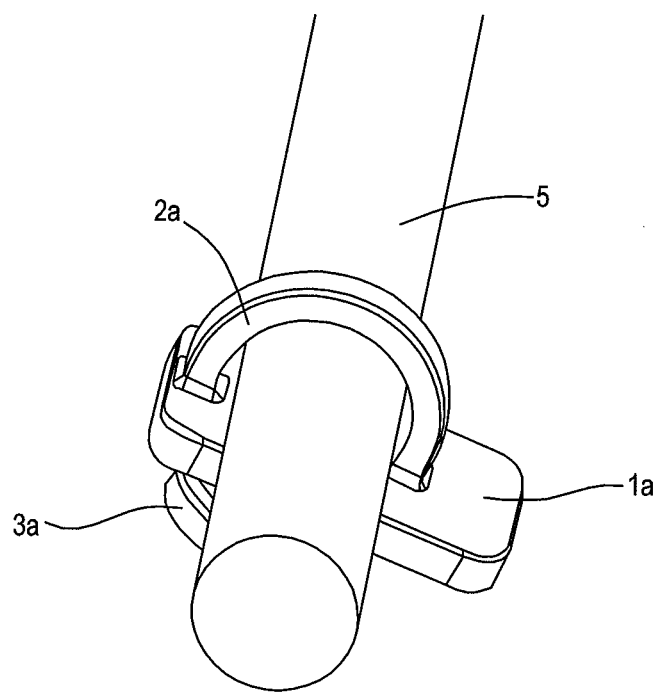
FIG. 4 is an illustration of a wire being fixed by the wire fixing structure of the liquid crystal display device according to the second embodiment of the present invention.

Referring to FIGS. 3 and 4, a second embodiment of a structure of the wire fixing structure of the liquid crystal display device of the present invention mainly comprises: a base 1a and a clamping portion 2a extended from the base 1a, which is of a consecutively rectangular shape, a wire fixing ring 4a is formed by an enclosure of the clamping portion 2a and the base 1a for a wire 5 to be inserted therein, wherein the base 1a has a first edge 40 and a second edge 41, and the enclosed ring arm has a first end 50 and a second end 51 disposed in a longitudinal direction of the base, and the first end 50 of the enclosed ring arm is disposed in contact with the first edge 40 of the base, and the second end 51 of the enclosed ring arm is disposed on a location of the base where keeps a predetermined distance from the second edge 41 of the base. Preferably, a radial dimension of the wire fixing ring 4a is slightly larger than a radial dimension of the wire 5, so that the wire 5 can be fixed securely in the wire fixing ring 4a. Similarly, the wire fixing structure further comprises a fixing portion 3a, its structure and function are the same as those of the fixing portion 3 in the first embodiment.

Main differences between the second embodiment and the first embodiment are: the clamping portion 2a includes a curved arm, preferably, the curved arm is an arc-shaped section, two ends of the curved arm are fixed on the base 1a, the clamping portion 2a is consecutively formed without the gap 22 in the first embodiment; in other words, the wire fixing ring 4a is a closed ring structure and the wire fixing ring 4 is an opened ring structure with the gap. These structural differences result in a different disposing of the wire 5: when the wire 5 is required to be installed into the wire fixing ring 4a, it is being threaded into the wire fixing ring 4a in order to be securely fixed in the wire fixing ring 4a.

Compared with existing techniques and according to the liquid crystal display device and its wire fixing structure of the present invention, by disposing the mutually cooperated base and the clamping portion, the wire fixing ring is formed by them for the wire to be inserted into, thereby the wire can be fixed securely and conveniently in the liquid crystal display device; furthermore, by disposing the fixing portion to be cooperated with the base, the wire fixing structure can therefore be disposed on the corresponding components of the liquid crystal display device with a high flexibility and can be used repeatedly.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A wire fixing structure of a liquid crystal display device, comprising:
    a base, being a consecutively rectangular shape;
    a clamping portion extended from the base; and
    a wire fixing ring being formed by an enclosure of the clamping portion and the base for a wire to be inserted into;
    wherein the clamping portion includes one enclosed ring arm, the one enclosed ring arm is an semicircular arc-shaped section consecutively with two ends of the curved arm fixed on the base;
    wherein the base has a first edge and a second edge, and the enclosed ring aim has a first end and a second end disposed in a longitudinal direction of the base, and the first end of the enclosed ring arm is disposed in contact with the first edge of the base, and the second end of the enclosed ring arm is disposed on a location of the base which keeps a predetermined distance from the second edge of base.

* * * * *